US012369300B2

(12) United States Patent
Kakumu et al.

(10) Patent No.: US 12,369,300 B2
(45) Date of Patent: Jul. 22, 2025

(54) SEMICONDUCTOR MEMORY DEVICE

(71) Applicant: Unisantis Electronics Singapore Pte. Ltd., Singapore (SG)

(72) Inventors: Masakazu Kakumu, Tokyo (JP); Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 127 days.

(21) Appl. No.: 18/190,511

(22) Filed: Mar. 27, 2023

(65) Prior Publication Data
US 2023/0320065 A1 Oct. 5, 2023

(30) Foreign Application Priority Data

Mar. 29, 2022 (WO) ................. PCT/JP2022/015550

(51) Int. Cl.
*G11C 11/404* (2006.01)
*G11C 11/4096* (2006.01)
*H10B 12/00* (2023.01)

(52) U.S. Cl.
CPC ............ *H10B 12/20* (2023.02); *G11C 11/404* (2013.01); *G11C 11/4096* (2013.01)

(58) Field of Classification Search
CPC ... H10B 12/20; G11C 11/404; G11C 11/4096; G11C 2211/4016
See application file for complete search history.

(56) References Cited

U.S. PATENT DOCUMENTS 7,149,109 B2 * 12/2006 Forbes ................... H10B 12/01
  257/E21.654
7,151,024 B1 * 12/2006 Forbes ................ H10D 30/711
  438/242

(Continued)

FOREIGN PATENT DOCUMENTS

JP    2003-188279 A    7/2003
JP    2009-212279 A    9/2009
WO    WO-2022239198 A1 * 11/2022 ........... G11C 11/404

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: "Impact of Surrounding Gate Transistor (SGT) for Ultra-High-Density LSI's", IEEE Transaction on Electron Devices, vol. 38, No. 3, pp. 573-578 (Mar. 1991).

(Continued)

*Primary Examiner* — Jay W. Radke
(74) *Attorney, Agent, or Firm* — Crowell & Moring LLP

(57) ABSTRACT

A p layer extending in a direction horizontal to a substrate is provided separately from the substrate. An n+ layer and an n layer are provided on respective sides of the layer. A gate insulating layer partially covers the layers. A gate conductor layer partially covers the layer. A gate insulating layer partially covering the layer is provided separately from the layer. A gate conductor layer partially covers the layer. An n+ layer is provided at part of the p layer between the layers. The layers are connected to a bit line, a control line, a word line, a plate line, and a source line, respectively. Memory operation of a dynamic flash memory cell is performed by manipulating voltage of each line.

11 Claims, 6 Drawing Sheets

(56) References Cited

U.S. PATENT DOCUMENTS

| | | | |
|---|---|---|---|
| 7,271,052 B1* | 9/2007 | Forbes | H10B 12/34 |
| | | | 438/242 |
| 7,271,433 B1* | 9/2007 | Forbes | H10D 30/711 |
| | | | 257/302 |
| 2003/0111681 A1 | 6/2003 | Kawanaka | |
| 2004/0041236 A1* | 3/2004 | Forbes | H10D 30/711 |
| | | | 257/E27.084 |
| 2006/0157738 A1 | 7/2006 | Kawanaka | |
| 2008/0137394 A1 | 6/2008 | Shimano et al. | |
| 2011/0096609 A1* | 4/2011 | Lee | G11C 16/10 |
| | | | 257/E27.06 |
| 2015/0092486 A1 | 4/2015 | Widjaja | |
| 2019/0206869 A1 | 7/2019 | Kim et al. | |

OTHER PUBLICATIONS

H. Chung, H. Kim, H. Kim, K. Kim, S. Kim, K. W.Song, J. Kim, Y.C. Oh, Y. Hwang, H. Hong, G. Jin, and C. Chung: "Novel 4F2 DRAM Cell with Vertical Pillar Transistor(VPT)," 2011 Proceeding of the European Solid-State Device Research Conference, (2011).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010).

K. Tsunoda, K .Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007), pp. 767-770.

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, vol. 62, No. 6, pp. 1-9 (Jun. 2015).

M. G. Ertosun, K. Lim, C. Park, J. Oh, P. Kirsch, and K. C. Saraswat : "Novel Capacitorless Single-Transistor Charge-Trap DRAM (1T CT DRAM) Utilizing Electron," IEEE Electron Device Letter, vol. 31, No. 5, pp. 405-407 (May 2010).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI," IEICE Trans. Electron., vol. E90-c., No. 4 pp. 765-771 (2007).

Md. Hasan Raza Ansari, Nupur Navlakha, Jae Yoon Lee, Seongjae Cho, "Double-Gate Junctionless 1T DRAM With Physical Barriers for Retention Improvement", IEEE Trans, on Electron Devices vol. 67, No. 4, pp. 1471-1479 (Apr. 2020).

"Future Scaling and Integration technology", International Electron Device Meeting Short Course (2021).

Takashi Ohasawa and Takeshi Hamamoto, "Floating Body Cell—a Novel Body Capacitorless DRAM Cell", Pan Stanford Publishing (2011).

IPER in Application No. PCT/JP2022/015550, dated Dec. 5, 2022.

* cited by examiner

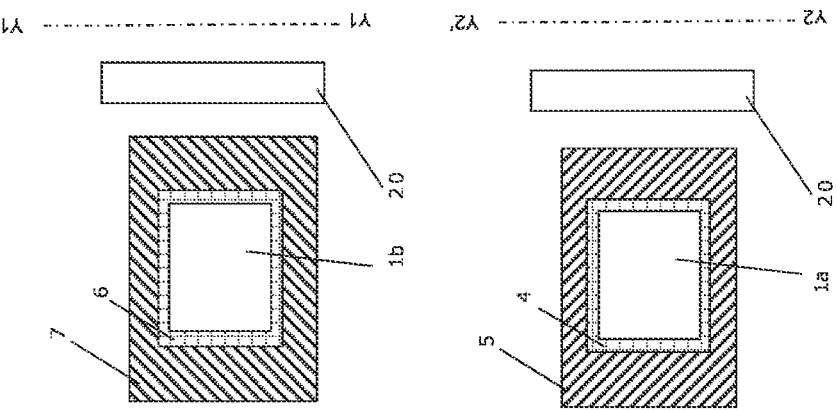
FIG.1C
FIG.1D
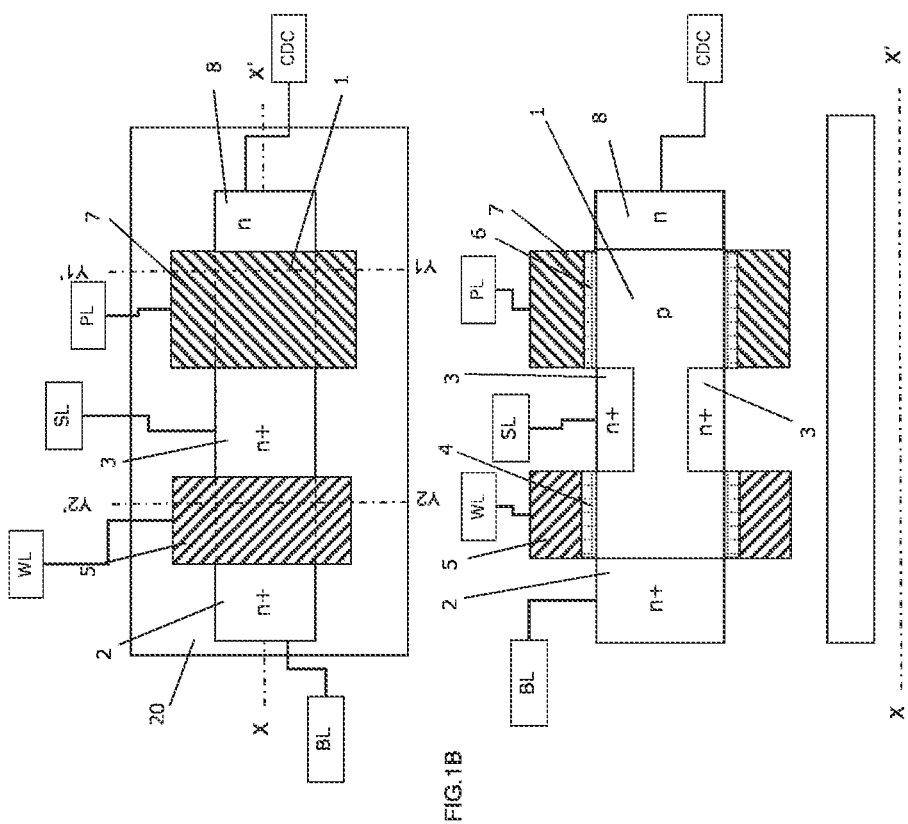
FIG.1A
FIG.1B

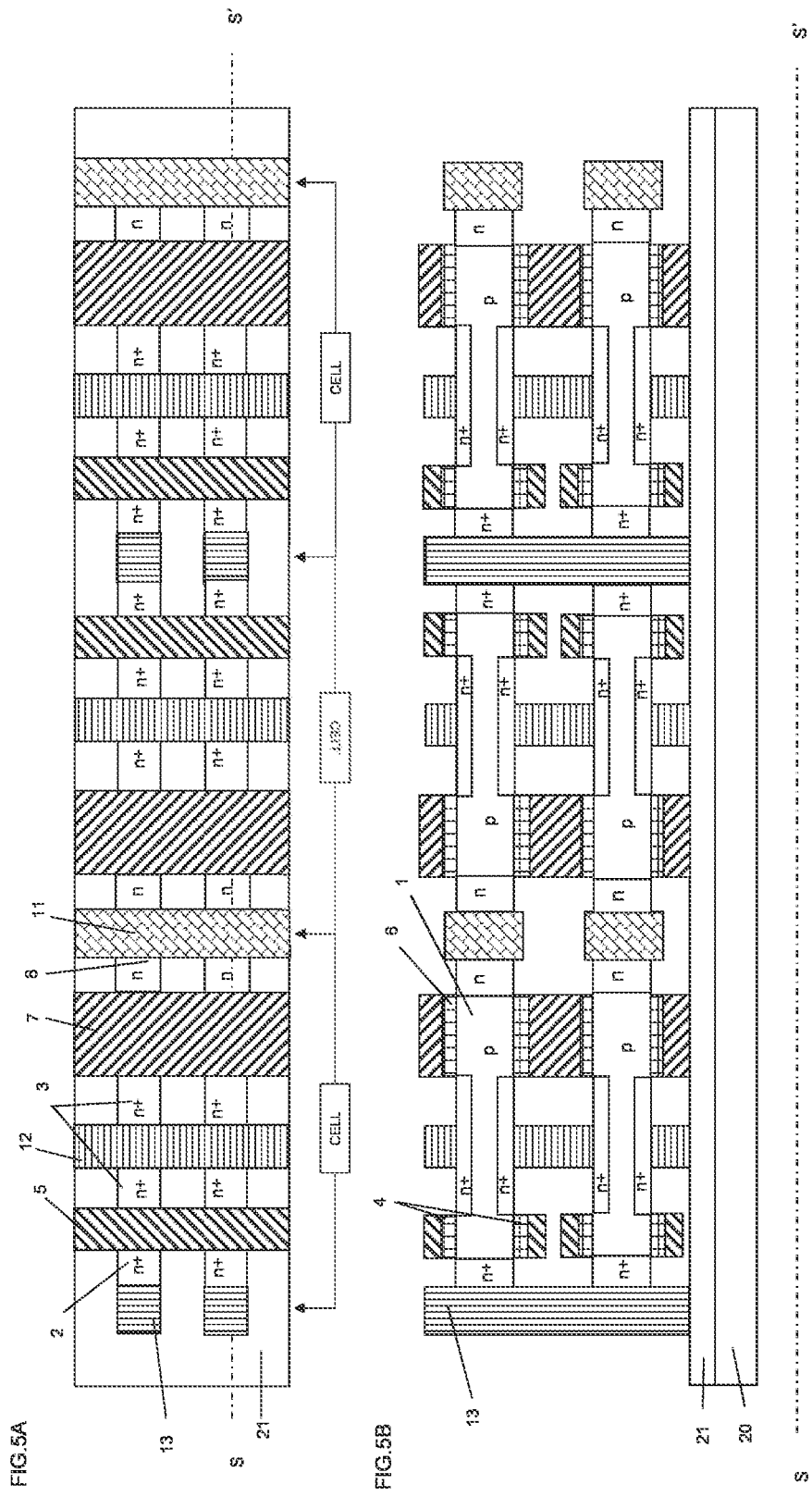

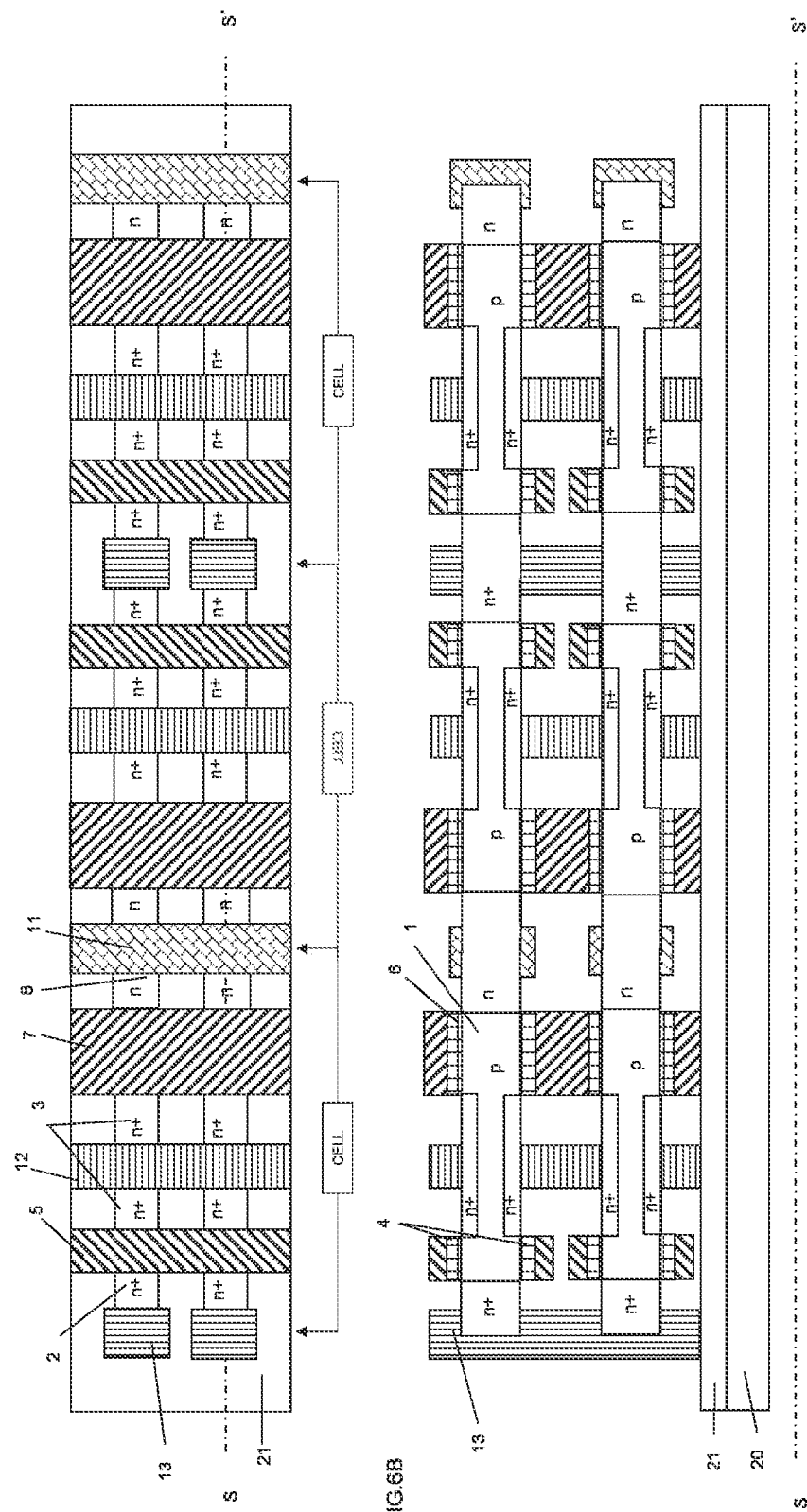

SEMICONDUCTOR MEMORY DEVICE

CROSS REFERENCE TO RELATED APPLICATIONS

This application claims priority to PCT/JP2022/015550, filed on Mar. 29, 2022, the entire content of which is incorporated herein by reference.

BACKGROUND OF THE INVENTION

Field of the Invention

The present invention relates to a semiconductor memory device.

Description of the Related Art

High integration, high performance, low electric power consumption, and high functionality of a memory element have been requested in recent development of large scale integration (LSI) technologies.

In a normal planar MOS transistor, a channel extends in a horizontal direction along the upper surface of a semiconductor substrate. However, a channel of an SGT extends in a direction orthogonal to the upper surface of a semiconductor substrate (refer to Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991), for example). Thus, densification of a semiconductor device is possible with the SGT unlike with the planar MOS transistor. The SGT can be used as a selection transistor to achieve high integration of a dynamic random access memory (DRAM; refer to H. Chung, H. Kim, H. Kim, K. Kim, S. Kim, K. W. Song, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011), for example) connected to a capacitor, a phase change memory (PCM; refer to H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No 12, December, pp. 2201-2227 (2010), for example) connected to a resistance change element, a resistive random access memory (RRAM; refer to K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3 V", IEDM (2007), for example), a magneto-resistive random access memory (MRAM; refer to W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015), for example) that changes resistance by changing the orientation of magnetic spin by current, and the like. In addition, there are, for example, a DRAM memory cell (refer to M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010) and Takashi Ohasawa and Takeshi Hamamoto, "Floating Body Cell—a Novel Body Capacitorless DRAM Cell", Pan Stanford Publishing (2011), for example) including no capacitor and constituted by one MOS transistor, a DRAM memory cell (refer to Md. Hasan Raza Ansari, Nupur Navlakha, Jae Yoon Lee, Seongjae Cho, "Double-Gate Junctionless 1T DRAM With Physical Barriers for Retention Improvement", IEEE Trans, on Electron Devices vol. 67, pp. 1471-1479 (2020), for example) including a groove portion in which carriers are accumulated and two gate electrodes. However, a DRAM including no capacitor has such a problem that a sufficient voltage margin cannot be obtained due to high dependency on coupling of a gate electrode from a word line of a floating body. Furthermore, when a substrate is completely depleted, adverse influence thereof is large. In addition, there is a twin-transistor memory element in which one memory cell is formed on a silicon-on-insulator (SOI) layer by using two MOS transistors (refer to US2008/0137394 A1 and US2003/0111681 A1, for example). In such an element, an n+ layer that functions as a source or a drain and divides floating body channels of the two MOS transistors is formed in contact with an insulating layer. Since the n+ layer is in contact with the insulating layer, the floating body channels of the two MOS transistors are electrically separated. Holes as signal electric charge are accumulated in the floating body channel of one of the transistors. The voltage of the floating body channel in which holes are accumulated largely changes with pulse voltage application to the gate electrode of the adjacent MOS transistor. Accordingly, the operation margin between "1" and "0" at writing cannot be set to be sufficiently large (refer to F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI", IEICE Trans. Electron., Vol. E90-c., No. 4 pp. 765-771 (2007), for example). The present application relates to a memory device including semiconductor elements, the memory device including no resistance change element nor capacitor but only including a MOS transistor.

SUMMARY OF THE INVENTION

The present application provides a memory device of a single-transistor DRAM including no capacitor, the memory device capable of solving problems such as noise due to coupling capacitance between a word line and a body, and false reading and false rewriting of storage data due to memory instability. The present application also provides a semiconductor memory device that achieves a highly-dense and high-speed MOS circuit by introducing a structure in which memory cells are stacked in the vertical direction by using a gate-all-around (GAA) technology (refer to "Future Scaling and Integration technology", International Electron Device Meeting Short Course (2021), for example).

To solve the above-described problem, a memory device including a semiconductor element according to the present invention includes a memory cell including:
  a semiconductor base material extending in a direction horizontal to a substrate;
  a first impurity region connected to one end of the semiconductor base material in a direction in which the semiconductor base material extends;
  a second impurity region connected to another end of the semiconductor base material on a side opposite the first impurity region;
  a first gate insulating layer partially covering the semiconductor base material;
  a first gate conductor layer covering the first gate insulating layer;

a second gate insulating layer partially covering the semiconductor base material without contacting the first gate conductor layer;

a second gate conductor layer covering the second gate insulating layer without contacting the first gate conductor layer; and a third impurity region formed at part of the semiconductor base material between the first gate conductor layer and the second gate conductor layer (first aspect).

In the above-described first aspect, work functions of the first gate conductor layer and the second gate conductor layer are different from each other (second aspect).

The semiconductor base material is included in a vertical section at a part where the third impurity region is formed (third aspect).

In the above-described first aspect, the memory cell includes a plurality of memory cells, the plurality of memory cells are provided separately from a first insulating layer on the substrate in a direction vertical to the substrate such that central axes of the respective memory cells are parallel to each other, and the memory device includes
a first conductor layer connected to the plurality of first impurity regions of the plurality of memory cells,
a third conductor layer connected to the plurality of second impurity regions of the plurality of memory cells, and
a second conductor layer connected to the plurality of third impurity regions of the plurality of memory cells (fourth aspect).

In the above-described fourth aspect, a plurality of arrays of the plurality of memory cells are provided in a horizontal direction parallel to the substrate such that central axes of the respective memory cells are parallel to each other, and an interval between the semiconductor base materials of memory cells adjacent to each other in the direction vertical to the substrate is larger than an interval between the semiconductor base materials of memory cells adjacent to each other in the direction horizontal to the substrate (fifth aspect).

In the above-described fifth aspect, the first gate conductor layers are shared by a plurality of memory cells adjacent to each other in the direction horizontal to the substrate (sixth aspect).

In the above-described fifth aspect, the second gate conductor layers are shared by a plurality of memory cells adjacent to each other in the direction horizontal or vertical to the substrate (seventh aspect).

In the above-described fourth aspect, an area of a surface at which each of the first conductor layers contacts a corresponding one of the first impurity regions is equal to or larger than an area of a section at which the semiconductor base material is connected to the first impurity region (eighth aspect).

In the above-described fourth aspect, an area of a surface at which each of the third conductor layers contacts a corresponding one of the second impurity regions is equal to or larger than an area of a section at which the semiconductor base material is connected to the second impurity region (ninth aspect).

In the above-described fourth aspect, at least one of the first impurity region and the second impurity region is shared by memory cells adjacent to each other in the direction horizontal to the substrate (tenth aspect).

In the above-described fourth aspect, the third conductor layers are shared by memory cells adjacent to each other in the horizontal direction and separated between memory cells adjacent to each other in the vertical direction (eleventh aspect).

In the above-described first aspect, impurity concentration of the second impurity region is lower than impurity concentration of the first impurity region or the third impurity region (twelfth aspect).

In the above-described first aspect, the first impurity region is connected to a bit line, the third impurity region is connected to a source line, the first gate conductor layer is connected to a word line, the second gate conductor layer is connected to a plate line, the second impurity region is connected to a control line, and memory writing and/or erasure is performed by applying voltage to each of the source line, the bit line, the plate line, the word line, and the control line (thirteenth aspect).

In the above-described thirteenth aspect, memory write operation is performed by controlling voltage applied to each of the bit line, the source line, the word line, the plate line, and the control line to perform operation of generating electrons and holes in the semiconductor base material and the first impurity region through an impact ionization phenomenon with current flowing between the first impurity region and the third impurity region or through gate induced drain leakage current and perform operation of retaining, in the semiconductor base material, some or all of either the generated electrons or holes that are majority carriers in the semiconductor base material, and memory erase operation is performed by controlling voltage applied to each of the bit line, the source line, the word line, the plate line, and the control line to remove either the retained electrons or holes that are majority carriers in the semiconductor base material from at least one of the first impurity region, the second impurity region, and the third impurity region (fourteenth aspect).

BRIEF DESCRIPTION OF THE DRAWINGS

FIGS. 1A, 1B, 1C, and 1D are diagrams illustrating sectional structures of a memory device including a semiconductor element according to a first embodiment;

FIGS. 5A and 5B are diagrams for description of an example of further arrangement of the cell disposition of the memory device including a semiconductor element according to the first embodiment in FIGS. 4A, 4B, 4C, and 4D; and FIGS. 6A and 6B are diagrams for description of an example of further arrangement of the cell disposition of the memory device including a semiconductor element according to the first embodiment in FIGS. 4A, 4B, 4C, and 4D.

DETAILED DESCRIPTION OF THE PREFERRED EMBODIMENTS

Figure 2C:
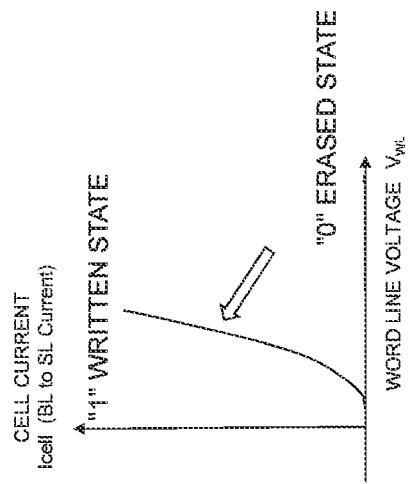
FIGS. 2A, 2B, and 2C are diagrams for description of write operation, carrier accumulation right after the operation, and cell current in the memory device including a semiconductor element according to the first embodiment.

The structure of a memory device including a semiconductor element, a drive method, accumulated carrier behavior, cell disposition of the semiconductor device, and a wiring structure according to the present invention will be described below with reference to the accompanying drawings.

First Embodiment

The structure and operation mechanism of a memory cell including a semiconductor element according to a first embodiment of the present invention will be described below with reference to FIGS. 1A to 3B. The cell structure of the memory including a semiconductor element according to the present embodiment will be described below with reference to FIGS. 1A, 1B, 1C, and 1D. The writing mechanism and carrier behavior of the memory including a semiconductor element will be described below with reference to FIGS. 2A, 2B, and 2C, and the data erasing mechanism thereof will be described below with reference to FIGS. 3A and 3B. In addition, an example of arrangement of four memory cells in a semiconductor device according to the present embodiment will be described below with reference to FIGS. 4A, 4B, 4C, and 4D, and a method of arranging memory cells according to the present embodiment will be described below with reference to FIGS. 5A and 5B and 6A and 6B.

FIGS. 1A, 1B, 1C, and 1D illustrate the structure of the memory cell including a semiconductor element according to the first embodiment of the present invention. FIG. 1A is a plan view, FIG. 1B is a cross-sectional view along line X-X', FIG. 1C is a cross-sectional view along line Y1-Y1', and FIG. 1D is a cross-sectional view along line Y2-Y2'.

A p layer 1 (example of a "semiconductor base material" in the claims) (hereinafter, a p layer semiconductor is referred to as a "p layer") is disposed above a substrate 20 (example of a "substrate" in the claims) and separately from the substrate 20 in the horizontal direction (line X-X' direction), the p layer 1 being a silicon semiconductor base material containing acceptor impurities, having a p-type or i-type (intrinsic type) conduction type, and having a rectangular section orthogonal to a central axis. An n+ layer 2 (hereinafter, a semiconductor region containing donor impurities at high concentration is referred to as an "n+ layer") (example of a "first impurity region" in the claims) is disposed on one side of the p layer 1 in the line X-X' direction. An n layer 8 (example of a "second impurity region" in the claims) (hereinafter, an n layer semiconductor is referred to as an "n layer") is disposed on the other side of the p layer 1 opposite the n+ layer 2 in the line X-X' direction. A gate insulating layer 4 (example of a "first gate insulating layer" in the claims) is disposed at part of the surface of the p layer 1 and in proximity to the n+ layer 2. A first gate conductor layer 5 (example of a "first gate conductor layer" in the claims) is disposed around part of the gate insulating layer 4. A gate insulating layer 6 (example of a "second gate insulating layer" in the claims) is disposed at part of the surface of the p layer 1 without contacting the gate conductor layer 5. A gate conductor layer 7 (example of a "second gate conductor layer" in the claims) partially covers the gate insulating layer 6 without contacting the gate conductor layer 5. An n+ layer 3 (example of a "third impurity region" in the claims) is disposed on the surface of the p layer 1 between the gate insulating layer 4 and the gate insulating layer 6 such that the p layer 1 is retained inside the n+ layer 3. Accordingly, one dynamic flash memory cell is formed by the p layer 1, the n+ layer 2, the n+ layer 3, the gate insulating layer 4, the gate insulating layer 6, the gate conductor layer 5, the gate conductor layer 7, and the n layer 8.

The n+ layer 3 is connected to a source line SL (example of a "source line" in the claims), and the gate conductor layer 7 is connected to a plate line PL (example of a "plate line" in the claims). The n+ layer 2 is connected to a bit line BL (example of a "bit line" in the claims). The gate conductor layer 5 is connected to a word line WL (example of a "word line" in the claims). The n layer 8 is connected to a control line CDC (example of "control line" in the claims). Memory operation is performed by manipulating the potential of each of the source line, the bit line, the plate line, the word line, and the control line. Such a memory device is referred to as a dynamic flash memory below.

The n+ layer 3 is formed around a periphery of the p layer 1 in FIGS. 1A, 1B, 1C, and 1D, and part of the p layer 1 needs to be retained at a central part of the n+ layer 3 as illustrated in FIG. 1B. The n+ layer 3 does not necessarily need to cover the entire periphery of the p layer 1 as illustrated in FIGS. 1A, 1B, 1C, and 1D, but only needs to exist at a part contacting the source line. The n+ layer 3 may be formed on the surface of the p layer 1 by using, for example, a selective epitaxial technology.

The p layer 1 is a p-type semiconductor in FIGS. 1A, 1B, 1C, and 1D, but a profile may be provided for impurity concentration. In addition, profiles may be provided for impurity concentration of the n+ layer 2, the n+ layer 3, and the n layer 8.

When the n+ layer 2 and the n+ layer 3 are formed as p+ layers (hereinafter, a semiconductor region containing acceptor impurities at high concentration is referred to as a "p+ layer") in which majority carriers are holes, operation of a dynamic flash memory is performed with electrons as writing carriers by employing an n-type semiconductor as the p layer 1 and a p-type semiconductor as the n layer 8.

The impurity concentration of the n layer 8 is lower than those of the n+ layer 2 and the n+ layer 3. This is to prevent unintended generation of holes or electrons by decreasing the strength of electric field in the vicinity of the n layer 8.

The substrate 20 in FIGS. 1A, 1B, 1C, and 1D may be made of an optional material such as an insulator, a semiconductor, or a conductor, on which an insulator can be formed and that support memory cells.

The gate conductor layers 5 and 7 may be formed of a metal or metal nitride such as W, Pd, Ru, Al, TiN, TaN, or WN, an alloy thereof (including silicide), a laminated structure such as TiN/W/TaN or of a semiconductor doped at high concentration as long as the layers can change the potential of part of the memory cell through the gate insulating layers 4 and 6, respectively.

In the semiconductor base material, a configuration in which a work function of the gate conductor layer 7 is higher than a work function of the gate conductor layer 5 is more effective for memory operation when majority carriers in the first and third impurity regions are electrons, and a configuration in which the work function of the gate conductor layer 7 is lower than the work function of the gate conductor layer 5 is more effective for memory operation when majority carriers in the first and second impurity regions are holes.

The gate conductor layers 5 and 7 may be formed by a method of simultaneously producing the gate conductor layers and thereafter separating the gate conductor layers by using patterning technologies.

Any insulating film used in a normal MOS process, such as a SiO2 film, a SiON film, a HfSiON film, or a SiO2/SiN multilayer film may be used as the gate insulating layers 4 and 6.

The gate insulating layers 4 and 6 may be formed by a method of simultaneously producing the gate insulating layers from the same material and thereafter separating the gate insulating layers.

The vertical section of each memory cell has a rectangular shape in the description with reference to FIGS. 1A, 1B, 1C, and 1D but may have a trapezoid shape, a polygonal shape, or a circular shape.

Each of the gate conductor layers 5 and 7 is a single layer in FIGS. 1A, 1B, 1C and 1D but may be divided in the direction horizontal or vertical to the substrate 20.

Figure 2A:
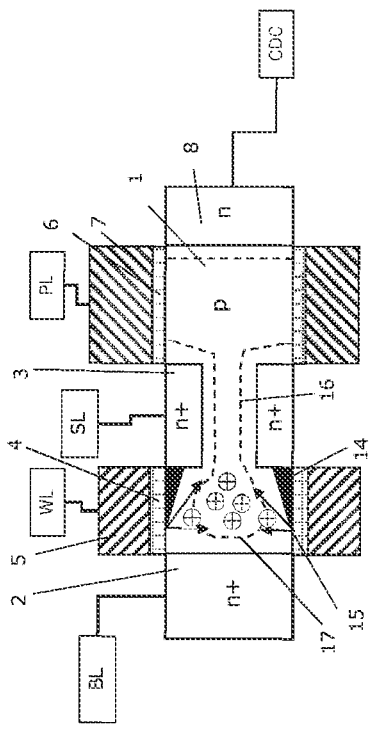
Figure 2B:
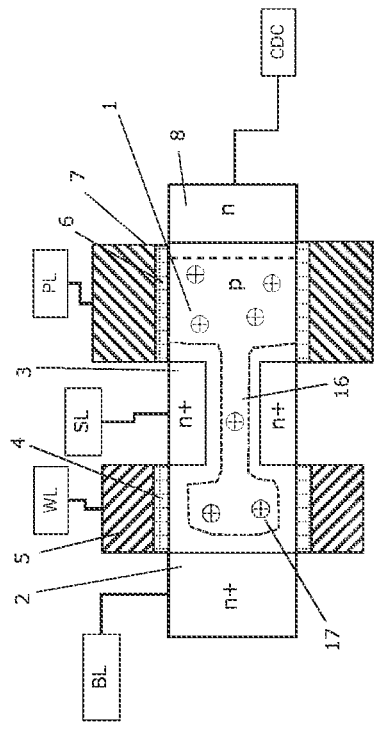

Carrier behavior, accumulation, and cell current in the dynamic flash memory according to the first embodiment of the present invention at write operation will be described below with reference to FIGS. 2A, 2B, and 2C. FIGS. 2A and 2B are diagrams based on FIG. 1B. Description is first made on a case in which majority carriers in the n+ layers 2 and 3 are electrons, and for example, n+ poly (hereinafter, poly Si containing donor impurities at high concentration is referred to as "n+ poly") is used for the gate conductor layer 5 connected to the word line WL, p+ poly (hereinafter, poly Si containing acceptor impurities at high concentration is referred to as "p+ poly") is used for the gate conductor layer 7 connected to the plate line PL, and a p-type semiconductor is used as the p layer 1 as illustrated in FIG. 2A. For example, 3 V is input to the n+ layer 2 connected to the bit line BL, for example, 0 V is input to the n+ layer 3 connected to the source line SL, for example, 1.5 V is input to the gate conductor layer 5 connected to the word line WL, for example, −1 V is input to the gate conductor layer 7 connected to the plate line PL, and for example, 0.6 V is input to the n layer connected to the control line CDC.

In this voltage applied state, electrons flow from the n+ layer 3 toward the n+ layer 2. An inversion layer 14 is formed at a surface part of the p layer 1 contacting the gate insulating layer 4, electric field becomes maximum at a pinch-off point 15, and an impact ionization phenomenon occurs in this region. Due to the impact ionization phenomenon, electrons accelerated from the n+ layer 3 connected to the source line SL toward the n+ layer 2 connected to the bit line BL collide with a Si lattice, and electron-hole pairs are generated by kinetic energy of the electrons. Some of the generated electrons flow to the gate conductor layer 5, but most of them flow to the n+ layer 2 connected to the bit line BL.

FIG. 2B illustrates holes 17 in the p layer 1 when all biases except for that of the n layer 8 connected to the control line CDC are 0 V right after writing. The generated holes 17 as majority carriers in the p layer 1 are temporarily accumulated in the p layer 1 partially surrounded by a depleted layer 16 and in the p layer 1 surrounded by the gate insulating layer 6 without a depleted layer and charge, to positive bias, the p layer 1 as the substrate of a MOSFET including the gate conductor layer 5 in effect in a non-equilibrium state. As a result, the threshold voltage of the MOSFET including the gate conductor layer 5 decreases by the positive substrate biasing effect with the holes temporarily accumulated in the p layer 1. Accordingly, the threshold voltage of the MOSFET including the gate conductor layer 5 connected to the word line WL becomes lower than that in the neutral state as illustrated in FIG. 2C. This written state is allocated as logically stored data "1". Since a material having a work function higher than that of the gate conductor layer 5 is used as the gate conductor layer 7, no depleted layer is generated at the interface between the gate insulating layer 6 and the p layer 1 and surplus holes can be more easily accumulated. The efficiency of accumulation of surplus holes is further increased by applying zero or positive voltage to the control line CDC.

The above-described conditions of voltage applied to the bit line BL, the source line SL, the word line WL, the plate line PL, and the control line CDC are examples for performing write operation but may be any other conditions of operation voltage with which write operation can be performed. In data writing methods, the above-described conditions of voltage applied to the bit line BL, the source line SL, the word line WL, the plate line PL, and the control line CDC may be any combination such as 3 V (BL)/0 V (SL)/0 V (PL)/1.5 V (WL)/0 V (CDC), 3 V (BL)/0 V (SL)/−1 V (PL)/1.5 V (WL)/0.6 V (CDC), or 3 V (BL)/0 V (SL)/−1 V (PL)/1.5 V (WL)/3 V (CDC).

The number of accumulated holes is determined by the volume of the p layer 1 surrounded by the gate conductor layer 7 illustrated in FIG. 1B. The number of accumulated holes can be increased by enlarging the cross-sectional area of the p layer 1 or increasing the length of the p layer 1 in the horizontal direction. In particular, the number of accumulated holes can be increased without sacrificing the area of the memory cell in a plan view by increasing the dimension of the p layer 1 in the direction vertical to the substrate.

Moreover, when the potential of the control line is fixed, the potential of the p layer 1 is stabilized, which is exploited to increase a time in which accumulated surplus holes are held.

Holes may be generated by causing flow of gate induction drain leakage (GIDL) current instead of causing the above-described impact ionization phenomenon (refer to Md. Hasan Raza Ansari, Nupur Navlakha, Jae Yoon Lee, Seongjae Cho, "Double-Gate Junctionless 1T DRAM With Physical Barriers for Retention Improvement", IEEE Trans, on Electron Devices vol. 67, pp. 1471-1479 (2020), for example).

Figure 3A:
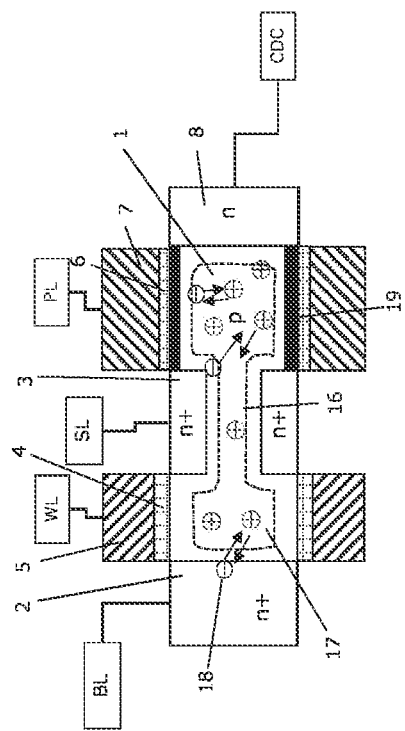
FIGS. 3A and 3B are diagrams for description of accumulation of hole carriers right after write operation, erase operation, and cell current in the memory device including a semiconductor element according to the first embodiment.
Figure 3B:
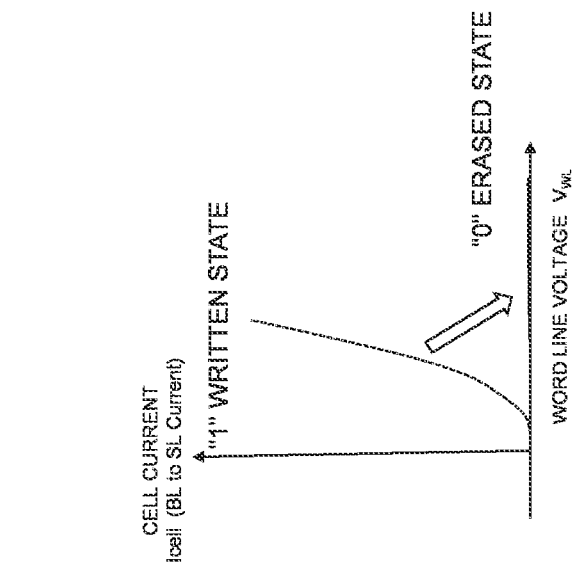

An erase operation mechanism of the dynamic flash memory according to the first embodiment illustrated in FIGS. 1A, 1B, 1C, and 1D will be described below with reference to FIGS. 3A and 3B. In the state illustrates in FIG. 2B, 0.6 V is applied to the bit line BL, 0 V is applied to the source line SL, 3 V is applied to the plate line PL, and 0.5 V is applied to the word line WL and the control line CDC. As a result, an inversion layer 19 is formed at the interface of the p layer 1 by 3 V applied to the plate line and electrically connected to the n+ layer 3 and the n layer 8. The concentration of holes in the p layer 1 to which "1" is written is sufficiently higher than those of the n+ layer 3, the n layer 8, and the inversion layer 19, and accordingly, holes flow into the n+ layer 3, the n layer 8, and the inversion layer 19 by diffusion due to the gradient of concentration. Conversely, the concentration of electrons in the n+ layer 3, the n layer 8, and the inversion layer 19 is higher than the concentration of electrons in the p layer 1, and accordingly, electrons 18 flow into the p layer 1 by diffusion due to the gradient of concentration. The electrons having flowed into the p layer 1 are annihilated through recombination with holes in the p layer 1. At erasing, since the formed inversion layer 19 is electrically connected to the n+ layer 3 and the n layer 8, the number of occurrences of recombination of holes and electrons is increased. However, not all injected electrons 18 are annihilated, and electrons 18 not annihilated flow into the n+ layer 2 through the depleted layer 16 by drifting due to the gradient of potential between the bit line BL and the source line SL. Since electrons are sequentially supplied from the source line SL, excessive holes recombine with electrons in an extremely short time and the initial state is reached again. Accordingly, as illustrated in FIG. 3B, the MOSFET including the gate conductor layer 5 connected to the word line WL returns to the original threshold value. This erased state of the storage element is allocated as logically stored data "0".

Voltage applied to the bit line is adjustable to any range higher or lower than 0.6 V as long as electron drift in the depleted layer 16 occurs with the voltage. Erase operation is possible with 0 V as well. In another data erasing methods, the above-described conditions of voltage applied to the bit line BL, the source line SL, the word line WL, and the plate line PL may be any combination such as 1.5 V (BL)/0 V (SL)/3 V (PL)/0 V (WL)/0 V (CDC), 0.6 V (BL)/0 V (SL)/0 V (PL)/3 V (WL)/0.6 V (CDC), 0 V (BL)/0.6 V (SL)/3 V (PL)/0 V (WL)/0.6 V (CDC), or 0 V (BL)/0 V (SL)/3 V (PL)/0 V (WL)/0.6 V (CDC), and the above-described conditions of voltage applied to the bit line BL, the source line SL, the word line WL, and the plate line PL are an example for performing erase operation and may be any other operation condition that erase operation can be performed.

Data erasure is basically determined with current due to recombination of surplus holes accumulated in the p layer 1 with electrons, and accordingly, only an extremely small amount of current flows from the source line SL and the control line CDC to the bit line BL.

Figure 4C:
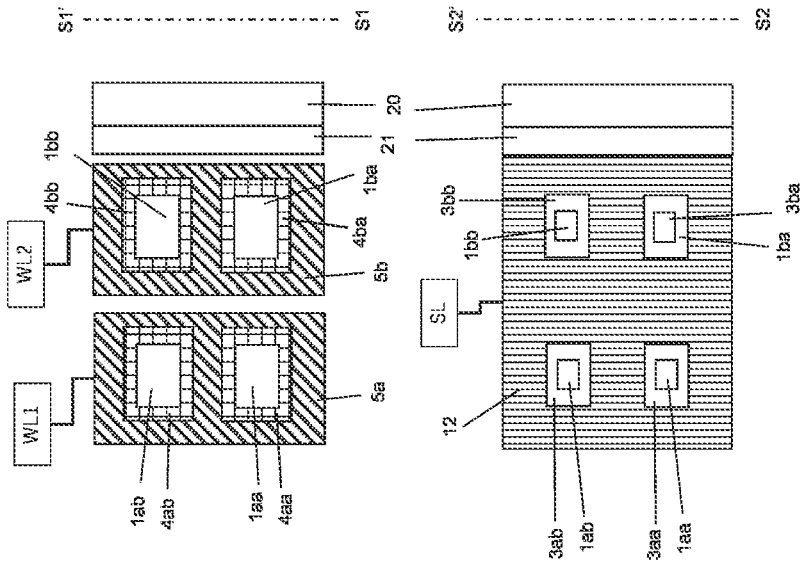
FIGS. 4A, 4B, 4C, and 4D are diagrams for description of cell disposition of the memory device including a semiconductor element according to the first embodiment.
Figure 4D:
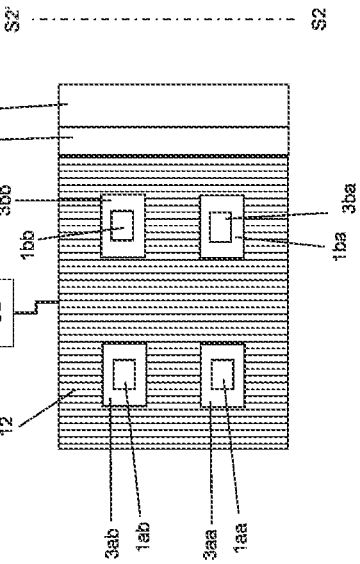
Figure 4A:
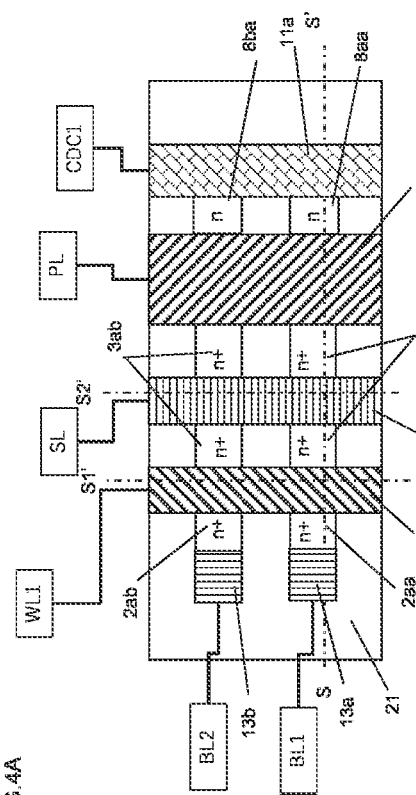
Figure 4B:
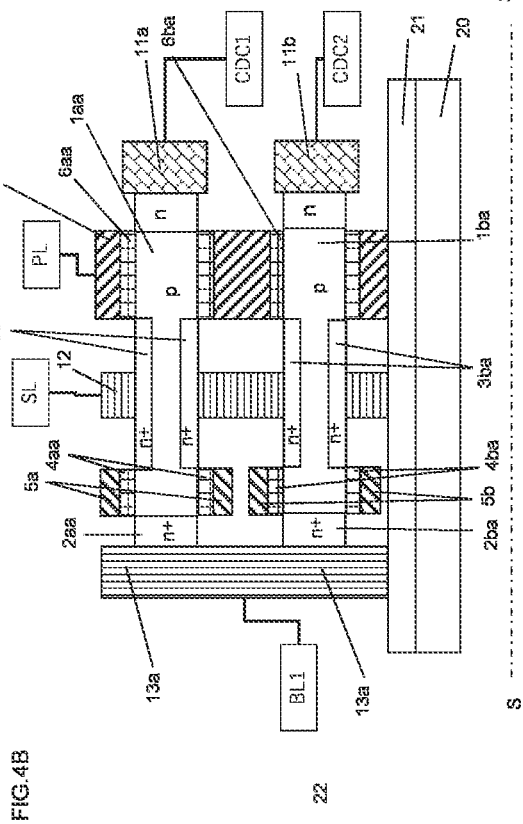

FIGS. 4A, 4B, 4C, and 4D are diagrams for description of cell disposition of the memory device including a semiconductor element according to the first embodiment; FIG. 4A is a plan view, FIG. 4B is a vertical cross-sectional view along line S-S' in FIG. 4A, FIGS. 4C and 4D are vertical cross-sectional views along line S1-S1' and line S2-S2', respectively, in FIG. 4A. In the example illustrated in FIGS. 4A, 4B, 4C, and 4D, above-described dynamic flash memory cells are arrayed on the substrate 20 and an insulating layer 21 (example of a "first insulating layer" in the claims) separately from each other in the vertical direction (hereinafter referred to as a "column direction" or a "column"; y direction), and such arrays are further arrayed in the horizontal direction (hereinafter, referred to as a "row direction" or a "row"; x direction). The memory cells are disposed in two rows and two columns in the example illustrated in FIGS. 4A, 4B, 4C, and 4D, but a larger number of memory cells may be disposed in an actual memory device.

FIG. 4B illustrates a cross-sectional view of two cells disposed on the first column. A memory cell on the first row and the first column is constituted by a p layer 1aa, an n+ layer 2aa, an n+ layer 3aa, a gate insulating layer 4aa, a gate conductor layer 5a, a gate insulating layer 6aa, a gate conductor layer 7, and an n layer 8aa as described above. A memory cell on the first row and the second column is constituted by a p layer 1ba, an n+ layer 2ba, an n+ layer 3ba, a gate insulating layer 4ba, a gate conductor layer 5b, a gate insulating layer 6ba, and a gate conductor layer 7, and an n layer 8ba. The n+ layers 2aa and 2ba are connected to a first conductor layer 13a (example of a "first conductor layer" in the claims). The n+ layers 3aa and 3ba are connected to a second conductor layer 12 (example of "second conductor layer" in the claims). The n layers 8aa and 8ba are connected to a third conductor layer 11 (example of a "third conductor layer" in the claims), and accordingly, a memory cell array on the first row is configured. Such memory cell arrays are arranged in the horizontal direction (upward direction in FIG. 1A) with respect to the substrate 20 to configure a memory device including a total of four memory cells on two columns and two rows.

FIG. 4C illustrates a sectional structure of a four-cell array along line S1-S1'. In the drawing, each cell is denoted by reference signs in the form of p layer 1xy and gate insulating layer 4xy. The letters x and y following the number in such a reference sign correspond to a row and a column, respectively. The letter "a" indicates the first row or the first column, and, similarly, the letter "b" indicates the second row or the second column (hereinafter, these rows and columns are collectively referred only with a number in some cases; for example, the p layers 1aa to 1bb are collectively referred to as p layers 1 in some cases). Each gate conductor layer 5x is shared by cells on the corresponding row, and for example, the gate conductor layer 5a is shared by cells including the p layers 1aa and 1ab. Similarly, the gate conductor layer 5b is shared by cells including the p layers 1ba and 1bb.

Although not illustrated, similarly to the gate conductor layer 5, the gate conductor layer 7a contacts the gate insulating layers 6aa and 6ab of the cells in common. The gate conductor layer 7b contacts the gate insulating layers 6ba and 6bb of the cells in common.

The conductor layer 12 only needs to contact the n+ layer 3 and may be separated in the vertical direction, similarly to the gate conductor layer 5 and the gate conductor layer 7.

FIG. 4D illustrates a sectional structure of a four-cell array along line S2-S2' at the conductor layer 12. The conductor layer 12 contacts the impurity regions 3aa to 3bb of the cells in common. The p layers 1 are disposed at a section of the respective cells.

FIGS. 5A and 5B illustrate an example of memory cell disposition for achieving a higher-density memory device according to the first embodiment of the present invention. FIG. 5A is a plan view, and FIG. 5B is a vertical cross-sectional view along line S-S' in FIG. 5A. In FIGS. 5A and 5B, any part identical or similar to a part in FIGS. 1A, 1B, 1C, and 1D is denoted by a reference sign with the same number as in FIGS. 1A, 1B, 1C, and 1D.

In FIG. 5A, the p layers 1aa to 1bb in FIGS. 4A, 4B, 4C, and 4D are collectively referred to as p layers 1, the n+ layers 2aa to 2bb are collectively referred to as n+ layers 2, the n+ layers 3aa to 3bb are collectively referred to as n+ layers 3, the gate insulating layers 4aa to 4bb are collectively referred to as gate insulating layers 4, the gate conductor layers 5a to 5b are collectively referred to as gate conductor layers 5, the wiring conductor layers 13a and 13b are collectively referred to as wiring conductor layers 13.

Constituent components included between a central part of the conductor layer 12 and a central part of each conductor layer 13 in FIG. 5A are referred to as "CELL". FIG. 5A illustrates an example in which units CELL in FIG. 5A are arranged in the positive direction, the right-left inverted direction, and the positive direction from the left on the insulating layer 21 contacting the substrate 20, the conductor layer 11 and the conductor layers 13 are shared by adjacent units, and accordingly, a total of 4×3=12 cells are disposed. Similarly, FIG. 5B illustrates a cross-sectional view of disposition in which units CELL in FIG. 5A are arranged in the positive direction, the right-left inverted direction, and the positive direction from the left and the conductor layers 11 and 13 are shared by adjacent units.

Although FIGS. 5A and 5B illustrate an example in which memory cells are arranged in the rightward direction, memory cells may be arranged in the upward direction in FIG. 5A or in the direction vertical to the substrate 20 in FIG. 5B.

Although the memory cells in FIGS. 5A and 5B are based on memory cells in FIGS. 1A, 1B, 1C, and 1D, the n+ layers 2 of adjacent cells may be connected to each other and partially covered by the conductor layer 13 as illustrated in FIGS. 6A and 6B.

Similarly, the n layers 8 of adjacent cells may be connected to each other and partially covered by the conductor layers 11 as illustrated in FIGS. 6A and 6B.

The present embodiment has the following characteristics.

(Characteristic 1)

The dynamic flash memory according to the first embodiment of the present invention includes the p layer 1 as the semiconductor base material, the first impurity region 2, the second impurity region 8, the third impurity region 3, the first gate insulating layer 4, the second gate insulating layer 6, the first gate conductor layer 5, and the second gate conductor layer 7. With this structure, majority carriers generated at writing of logic data "1" can be accumulated in the first p layer 1 as the semiconductor base material and the number of the accumulated holes can be increased by adjusting the volume thereof, and thus an information holding time increases. At data erasing, positive voltage is applied to the second gate conductor layer 7 connected to the plate line PL to form an inversion layer at the interface between the second gate insulating layer 6 and the p layer 1, fixed voltage is applied to the control line CDC to increase the area of recombination of surplus holes and electrons, and voltage is applied to the first impurity region 2 to prompt carrier drifting, thereby facilitating erasure. Thus, the margin of memory operation can be expanded and electric power consumption can be reduced, which leads to high-speed memory operation.

(Characteristic 2)

In the dynamic flash memory according to the first embodiment of the present invention, a plurality of memory cells are stacked in the direction vertical to the substrate, and adjacent cells are electrically shielded from each other by the gate conductor layers 5. In conventional memory cell disposition, when memory cells are highly densely disposed with a minimum line width, electric mutual interaction between the memory cells increases. However, memory density decreases when the word-line interval between cells is increased to prevent the mutual interaction. According to the first embodiment of the present invention, it is possible to achieve memory cell disposition with less mutual interaction without changing area in a plan view, thereby achieving highly-dense and wide-margin memory cell disposition.

(Characteristic 3)

In the dynamic flash memory according to the first embodiment of the present invention, it is possible to freely adjust the thickness in the vertical direction and the length on the horizontal direction of the p layer 1 of each memory cell without sacrificing memory density in a plan view, and thus it is possible to increase the number of carriers at writing, thereby achieving a wider margin of memory operation.

(Characteristic 4)

In the dynamic flash memory according to the first embodiment of the present invention, it is possible to increase the interval between memory cells in the direction vertical to the substrate without sacrificing memory density. Thus, it is possible to increase the interval between the word lines 5 of the memories in the vertical direction, thereby reducing parasitic capacitance as compared to conventional cases. Moreover, it is possible to increase the thickness of each word line 5 in the vertical direction in effect, thereby reducing parasitic resistance. This contributes to high-speed memory operation.

(Characteristic 5)

In the dynamic flash memory according to the first embodiment of the present invention, it is possible to connect a plurality of memory cells to conductor layers 13 connected to bit lines BL in the vertical direction. Thus, it is possible to achieve short wiring as compared to conventional cases in which memory cells are two-dimensionally disposed. Accordingly, parasitic resistance and parasitic capacitance are reduced as compared to conventional cases, which leads to higher-speed memory operation with a wider operation margin. In conventional memory cell disposition, it is important to connect a larger number of memory cells to the same bit line in order to reduce area in a plan view. However, when a large number of cells are connected to the same bit line, two-dimensional arrangement dependency of parasitic resistance and parasitic capacitance becomes larger and the memory operation margin becomes narrower, which has been a problem.

(Characteristic 6)

A memory cell connected to a word line that activates the memory is the same as a memory cell connected to a control line, and the memory can be made robust against external noise by applying optimum voltage to the control line of a cell to be read and written and by applying fixed voltage to the control lines of cells other than the cell to be read and written.

The present invention can have various embodiments and modifications without departing from the spirit and scope of the present invention in a broad sense. Each above-described embodiment is only intended to describe an example of the present invention and does not limit the scope of the present invention. Any above-described example and modification may be optionally combined. Some constituent components of the above-described embodiment may be omitted as necessary within the technological idea of the present invention.

Industrial Applicability

With a semiconductor element according to the present invention, it is possible to provide a higher-density and higher-speed semiconductor memory device with a high operation margin as compared to conventional cases.

What is claimed is:

1. A memory device including a semiconductor element, the memory device including a memory cell comprising:
   a semiconductor base material extending in a length direction horizontal to a substrate, wherein the semiconductor base material has a first end and second end arranged in the length direction of the semiconductor base material;
   a first impurity region connected to the first end of the semiconductor base material;
   a second impurity region connected to the second end of the semiconductor base material;
   a first gate insulating layer partially covering the semiconductor base material;
   a first gate conductor layer covering the first gate insulating layer;
   a second gate insulating layer partially covering the semiconductor base material, wherein the first and second gate insulating layers are arranged along the length direction of the semiconductor base material with a space between them;

a second gate conductor layer covering the second gate insulating layer without contacting the first gate conductor layer; and a third impurity region formed on the semiconductor base material between the first gate conductor layer and the second gate conductor layer, wherein the semiconductor base material forms a single channel region throughout its length direction for storing carriers therethrough, wherein the first impurity region is connected to a bit line, the third impurity region is connected to a source line, the first gate conductor layer is connected to a word line, the second gate conductor layer is connected to a plate line, the second impurity region is connected to a control line, and memory writing and/or erasure is performed by applying voltage to each of the source line, the bit line, the plate line, the word line, and the control line, and wherein work functions of the first gate conductor layer and the second gate conductor layer are different from each other.

2. The memory device including a semiconductor element according to claim 1, wherein the memory cell includes a plurality of memory cells, the plurality of memory cells are provided separately from each other in a direction vertical to the substrate, and are separated in the vertical direction by a first insulating layer such that central axes of the respective memory cells are parallel to each other, and the memory device includes
   a first conductor layer connected to the plurality of first impurity regions of the plurality of memory cells,
   a third conductor layer connected to the plurality of second impurity regions of the plurality of memory cells, and
   a second conductor layer connected to the plurality of third impurity regions of the plurality of memory cells.

3. The memory device including a semiconductor element according to claim 2, wherein a plurality of arrays of the plurality of memory cells are provided in a horizontal direction parallel to the substrate such that central axes of the respective memory cells are parallel to each other, and an interval between the semiconductor base materials of memory cells adjacent to each other in the direction vertical to the substrate is larger than an interval between the semiconductor base materials of memory cells adjacent to each other in the direction horizontal to the substrate.

4. The memory device including a semiconductor element according to claim 3, wherein the first gate conductor layers are shared by a plurality of memory cells adjacent to each other in the direction horizontal to the substrate.

5. The memory device including a semiconductor element according to claim 3, wherein the second gate conductor layers are shared by a plurality of memory cells adjacent to each other in the direction horizontal or vertical to the substrate.

6. The memory device including a semiconductor element according to claim 2, wherein an area of a surface at which each of the first conductor layers contacts a corresponding one of the first impurity regions is equal to or larger than an area of a section at which the semiconductor base material is connected to the first impurity region.

7. The memory device including a semiconductor element according to claim 2, wherein an area of a surface at which each of the third conductor layers contacts a corresponding one of the second impurity regions is equal to or larger than an area of a section at which the semiconductor base material is connected to the second impurity region.

8. The memory device including a semiconductor element according to claim 2, wherein at least one of the first impurity region and the second impurity region is shared by memory cells adjacent to each other in the direction horizontal to the substrate.

9. The memory device including a semiconductor element according to claim 2, wherein the third conductor layers are shared by memory cells adjacent to each other in the horizontal direction and separated between memory cells adjacent to each other in the vertical direction.

10. The memory device including a semiconductor element according to claim 1, wherein impurity concentration of the second impurity region is lower than impurity concentration of the first impurity region or the third impurity region.

11. The memory device including a semiconductor element according to claim 1, wherein memory write operation is performed by controlling voltage applied to each of the bit line, the source line, the word line, the plate line, and the control line to perform operation of generating electrons and holes in the semiconductor base material and the first impurity region through an impact ionization phenomenon with current flowing between the first impurity region and the third impurity region or through gate induced drain leakage current and perform operation of retaining, in the semiconductor base material, some or all of either the generated electrons or holes that are majority carriers in the semiconductor base material, and memory erase operation is performed by controlling voltage applied to each of the bit line, the source line, the word line, the plate line, and the control line to remove either the retained electrons or holes that are majority carriers in the semiconductor base material from at least one of the first impurity region, the second impurity region, and the third impurity region.

* * * * *